United States Patent
Kang et al.

(10) Patent No.: US 8,868,017 B2
(45) Date of Patent: Oct. 21, 2014

(54) RECTIFIER, RECEIVED SIGNAL STRENGTH INDICATOR, AND RECEIVER

(71) Applicant: Electronics and Telecommunications Research Institute, Daejeon (KR)

(72) Inventors: Hoyong Kang, Daejeon (KR); Nguyen Trung Kien, Daejeon (KR); Se Han Kim, Daejeon (KR); Tae Joon Park, Daejeon (KR); Wun-Cheol Jeong, Daejeon (KR); Chang Sub Shin, Daejeon (KR); In Hwan Lee, Daejeon (KR); Cheol Sig Pyo, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 21 days.

(21) Appl. No.: 13/716,443

(22) Filed: Dec. 17, 2012

(65) Prior Publication Data
US 2013/0156084 A1 Jun. 20, 2013

(30) Foreign Application Priority Data
Dec. 15, 2011 (KR) .................... 10-2011-0135629

(51) Int. Cl.
| | |
|---|---|
| H04B 17/00 | (2006.01) |
| G06G 7/24 | (2006.01) |
| H03F 3/45 | (2006.01) |
| H02M 7/23 | (2006.01) |

(52) U.S. Cl.
CPC .. *H04B 17/0057* (2013.01); *H03F 2203/45008* (2013.01); *H03F 3/45183* (2013.01); *H03F 3/45179* (2013.01); *H03F 3/45071* (2013.01); *H03F 2203/45082* (2013.01); *H03F 2203/45138* (2013.01); *H03F 3/45973* (2013.01); *H03F 3/45659* (2013.01); *H03F 3/45475* (2013.01); *H02M 7/23* (2013.01)
USPC ........................ 455/226.2; 327/350

(58) Field of Classification Search
USPC ............ 455/226.1, 226.2, 226.4; 327/50, 58, 327/103, 350
See application file for complete search history.

(56) References Cited

U.S. PATENT DOCUMENTS

| | | | | |
|---|---|---|---|---|
| 5,471,166 | A | * | 11/1995 | Kimura .......................... 327/351 |
| 6,311,049 | B1 | * | 10/2001 | Yoshizawa ................. 455/250.1 |
| 7,095,256 | B1 | | 8/2006 | Zhak et al. |
| 7,592,794 | B2 | | 9/2009 | Bock |
| 2006/0154628 | A1 | * | 7/2006 | Mochizuki .................... 455/134 |

OTHER PUBLICATIONS

Chi-Hung Lin, et al; "A 1.2V Micropower CMOS Class-AB V-I Converter for VLSI Cells Library Design", Midwest Symposium on Circuits and Systems, pp. 364-367, Aug. 1998.
Po-Chiun Huang, et al; "A 2-V 10.7-MHz CMOS Limiting Amplifier/RSSI", IEEE Journal of Solid-State Circuits, vol. 35, No. 10, Oct. 2000, pp. 1474-1480.

* cited by examiner

Primary Examiner — Nguyen Vo
(74) Attorney, Agent, or Firm — Ladas & Parry LLP

(57) ABSTRACT

A received signal strength indicator is provided. The received signal strength indicator includes a plurality of differential amplifiers forming an amplifier chain for amplifying differential signals and a plurality of rectifiers for rectifying signals output from the plurality of differential amplifiers and the differential signals, and a low pass filter for combining the signals rectified by the plurality of rectifiers to output received signal strength. Each rectifier includes a class AB voltage-current converter for converting a differential voltage into a current, and two triode transistors.

18 Claims, 8 Drawing Sheets

RECTIFIER, RECEIVED SIGNAL STRENGTH INDICATOR, AND RECEIVER

CROSS-REFERENCE TO RELATED APPLICATION

This application claims priority to and the benefit of Korean Patent Application No. 10-2011-0135629 filed in the Korean Intellectual Property Office on Dec. 15, 2011, the entire contents of which are incorporated herein by reference.

BACKGROUND OF THE INVENTION (a) Field of the Invention

The present invention relates to a rectifier, a received signal strength indicator, and a receiver.

(b) Description of the Related Art

In a wireless communication transceiver, a received signal strength indicator (RSSI) has a crucial role in detecting received signal power because it provides the information necessary to adjust the gain of a receiver. Also, the RSSI can be used for a localization system thanks to the relation between RF power and distance.

In RSSI design, the most important performance factors are low power, a wide dynamic range, and accuracy. To obtain a wide dynamic range, the RSSI is generally realized in a logarithmic form because the wide dynamic variation of the received signal can be represented within a limited indication range.

However, when a voltage of lower than 2 V is supplied to the RSSI in the logarithmic form, a nonlinear term can occur.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a received signal strength indicator having advantages of improving linearity with a low voltage.

An exemplary embodiment of the present invention provides a rectifier including: a first transistor including a gate electrode connected to an input voltage; a second transistor including a gate electrode connected to a second input voltage; a third transistor including a source electrode connected to a source electrode of the first transistor, a drain electrode connected to a source electrode of the second transistor, and a gate electrode connected to the first input voltage; and a fourth transistor including a source electrode connected to the source electrode of the first transistor, a drain electrode connected to the source electrode of the second transistor, and a gate electrode connected to the second input voltage.

The rectifier may further include a fifth transistor including a gate electrode connected to a drain electrode of the first transistor, and a sixth transistor including a gate electrode connected to a source electrode of the fifth transistor.

The rectifier may further include a seventh transistor for including a gate electrode connected to a drain electrode of the second transistor, an eighth transistor including a gate electrode connected to a source electrode of the seventh transistor, and a ninth transistor including a gate electrode connected to a drain electrode of the eighth transistor and a drain electrode connected to a drain electrode of the sixth transistor.

The rectifier may further include a tenth transistor including a gate electrode connected to a bias voltage and a drain electrode connected to the drain electrode of the firth transistor, and an eleventh transistor including a gate electrode connected to a bias voltage and a drain electrode connected to the drain electrode of the second transistor.

The rectifier may further include a twelfth transistor including a drain electrode connected to the source electrode of the first transistor and a gate electrode connected to the source electrode of the fifth transistor, and a thirteenth transistor including a drain electrode connected to the source electrode of the second transistor and a gate electrode connected to the source electrode of the seventh transistor.

The rectifier may further include a fourteenth transistor including a drain electrode connected to the source electrode of the seventh transistor and a gate electrode connected to the source electrode of the seventh transistor, and a fifteenth transistor including a drain electrode connected to the source electrode of the fifth transistor and a gate electrode connected to the source electrode of the fifth transistor.

The rectifier may include a sixteenth transistor including a drain electrode connected to the drain electrode of the eighth transistor and a gate electrode connected to the drain electrode of the eighth transistor.

Another exemplary embodiment of the present invention provides a rectifier including: a class AB voltage-current converter including a first transistor of which a gate electrode is connected to a first input voltage and a second transistor of which a gate electrode is connected to a second input voltage; a third transistor including a source electrode connected to a source electrode of the first transistor, a drain electrode connected to a source electrode of the second transistor, and a gate electrode connected to the first input voltage; and a fourth transistor including a source electrode connected to the source electrode of the first transistor, a drain electrode connected to the source electrode of the second transistor, and a gate electrode connected to the second input voltage.

The rectifier may further include a fifth transistor including a gate electrode connected to a drain electrode of the first transistor, and a sixth transistor including a gate electrode connected to a source electrode of the fifth transistor.

The rectifier may further include a seventh transistor including a gate electrode connected to the source electrode of the second transistor, an eighth transistor including a gate electrode connected to a source electrode of the seventh transistor, and a ninth transistor including a gate electrode connected to a drain electrode of the eighth transistor and a drain electrode connected to the drain electrode of the fourth transistor.

Yet another exemplary embodiment of the present invention provides a received signal strength indicator, including a plurality of differential amplifiers for forming an amplifier chain that amplifies differential signals, a plurality of rectifiers for rectifying output signals from the plurality of differential amplifiers and the differential signals, respectively, and a first low pass filter for combining output signals from the plurality of rectifiers and outputting received signal strength.

Here, at least one input among inputs for the plurality of rectifiers includes a first input voltage and a second input voltage, and at least one among the plurality of rectifiers includes a first transistor including a gate electrode connected to the first input voltage, and a second transistor including a source electrode connected to a source electrode of the first transistor, a drain electrode connected to a drain electrode of the first transistor, and a gate electrode connected to the second input voltage.

The at least one among the plurality of rectifiers may further include a third transistor including a gate electrode connected to the first input voltage and a source electrode connected to the source electrode of the first transistor, and a fourth transistor including a gate electrode connected to the second input voltage and a source electrode connected to the drain electrode of the first transistor.

The received signal strength indicator may further include a fifth transistor including a gate electrode connected to a drain electrode of the third transistor, and a sixth transistor including a gate electrode connected to a source electrode of the fifth transistor.

The received signal strength indicator may further include a seventh transistor including a gate electrode connected to a drain electrode of the fourth transistor, an eighth transistor including a gate electrode connected to a source electrode of the seventh transistor, and a ninth transistor including a gate electrode connected to a drain electrode of the eighth transistor and a drain electrode connected to a drain electrode of the sixth transistor.

At least one among the plurality of differential amplifiers may be provided with a third input voltage and outputs a first output voltage. Here, at least one among the plurality of differential amplifiers may include a fifth transistor including a gate electrode connected to the third input voltage and a drain electrode connected to the first output voltage, and a sixth transistor including a drain electrode connected to the drain electrode of the sixth transistor.

At least one among the plurality of differential amplifiers may be further provided with a fourth input voltage and further outputs a second output voltage. Here, at least one among the plurality of differential amplifiers may include a seventh transistor including a gate electrode connected to the fourth input voltage and a drain electrode connected to the second output voltage, an eighth transistor including a drain electrode connected to the drain electrode of the seventh transistor, and a ninth transistor including a gate electrode connected to a bias voltage.

The at least one among the plurality of differential amplifiers may further include: a first resistor including a terminal connected to the drain electrode of the sixth transistor; a second resistor including a terminal connected to the drain electrode of the eighth transistor and the other terminal connected to the other terminal of the first resistor; a tenth transistor including a gate electrode connected to a gate electrode of the sixth transistor and a drain electrode connected to the gate electrode of the sixth transistor; an eleventh transistor including a drain electrode connected to the drain electrode of the tenth transistor and a gate electrode connected to the other terminal of the first resistor; a twelfth transistor including a source electrode connected to a source electrode of the eleventh transistor and a gate electrode connected to a reference voltage; and a thirteenth transistor including a drain electrode connected to the source electrode and a gate electrode connected to the bias voltage.

The received signal strength indicator may further include a second low pass filter and a fifth transistor.

Yet another exemplary embodiment of the present invention provides a receiver including a first low pass filter for filtering an in-phase signal, a second low pass filter for filtering a quadrature phase signal, and a received signal strength indicator.

Here, the received signal strength indicator includes a plurality of differential amplifiers for forming an amplifier chain that uses the filtered in-phase signal and the filtered quadrature phase signal as differential signals and amplifies the differential signals, and a plurality of rectifiers for rectifying output signals from the plurality of differential amplifiers and the differential signals, respectively. Also, at least one among the plurality of rectifiers includes a first transistor for including a gate electrode connected to the first input voltage, and a second transistor for including a source electrode connected to a source electrode of the first transistor, a drain electrode connected to a drain electrode of the first transistor, and a gate electrode connected to the second input voltage.

The at least one among the plurality of rectifiers may further include a third transistor including a gate electrode connected to the first input voltage and a source electrode connected to the source electrode of the first transistor, and a second transistor including a gate electrode connected to the second input voltage and a source electrode connected to the drain electrode of the first transistor.

DETAILED DESCRIPTION OF THE EMBODIMENTS

Figure 1:
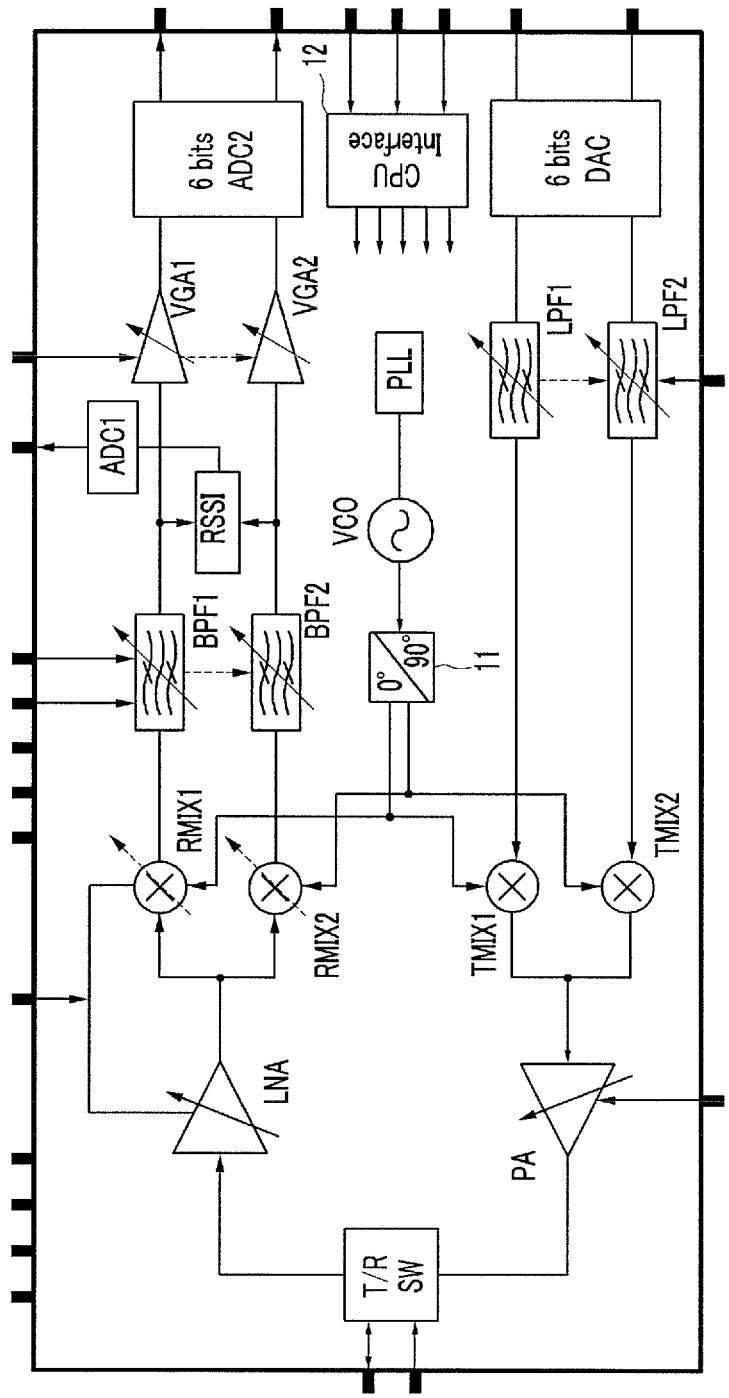
FIG. 1 shows a block diagram of a wireless transceiver according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element.

Throughout this specification, in addition, unless explicitly described to the contrary, the word "comprise" and variations such as "comprises" or "comprising" will be understood to imply the inclusion of stated elements but not the exclusion of any other elements.

Hereinafter, a wireless transceiver and a received signal strength indicator according to an exemplary embodiment of the present invention will be described with reference to the drawings.

FIG. 1 shows a block diagram of a wireless transceiver according to an exemplary embodiment of the present invention.

As shown in FIG. 1, the wireless transceiver according to an exemplary embodiment of the present invention includes a wireless transmit/receive signal switch T/R SW, a low noise amplifier LNA, two received signal down conversion mixers RMIX1 and RMIX2, two band pass filters BPF1 and BPF2, a phase-locked loop PLL, a voltage controlled oscillator VCO, a phase delaying unit 11, a received signal strength indicator RSS, a first analog-digital converter ADC1, two variable gain amplifiers VGA1 and VGA2, a second analog-digital converter ADC2, a central processing unit (CPU) interfacing unit 12, a digital-to-analog converter DAC, two low pass filters LPF1 and LPF2, two transmitting signal mixers TMIX1 and TMIX2, and a power amplifier PA.

The wireless transmit/receive signal switch T/R SW provides a wireless signal received from an antenna to the low noise amplifier LNA and provides a signal amplified by the power amplifier PA to the antenna.

The receive wireless signal is amplified by the low noise amplifier LNA and is then converted into an in-phase signal and a quadrature phase signal by the received signal down conversion mixers RMIX1 and RMIX2, respectively. The in-phase signal and the quadrature phase signal are filtered by the band pass filters BPF1 and BPF2, respectively, and are then amplified by the variable gain amplifiers VGA1 and VGA2, respectively. The amplified in-phase signal and quadrature phase signal are converted into digital signals by the second analog-digital converter ADC2.

The output signal of the received signal strength indicator RSSI is used for measuring location. In FIG. 1, the received signal strength indicator RSSI is located in the rear of the band pass filters BPF1 and BPF2 for channel selection. In this case, the input signal of the received signal strength indicator RSSI is the output signals of the band pass filters BPF1 and BPF2. Meanwhile, the received signal strength indicator RSSI may be located in the rear of the low noise amplifier LNA or the two received signal down conversion mixers RMIX1 and RMIX2. The analog output signal of the received signal strength indicator RSSI is converted into a digital signal by the first analog to digital converter ADC1 to be used for digital signal processing.

The in-phase signal and the quadrature phase signal are converted into analog signals by the digital-to-analog converter DAC, filtered by the low pass filters LPF1 and LPF2, and then up-converted by the transmitting signal mixers TMIX1 and TMIX2, respectively. The power amplifier PA amplifies the up-converted signals and provides them to the wireless transmitted/received signal switch T/R SW.

Next, referring to FIG. 2, the received signal strength indicator RSSI according to an exemplary embodiment of the present invention will be described.

Figure 2:
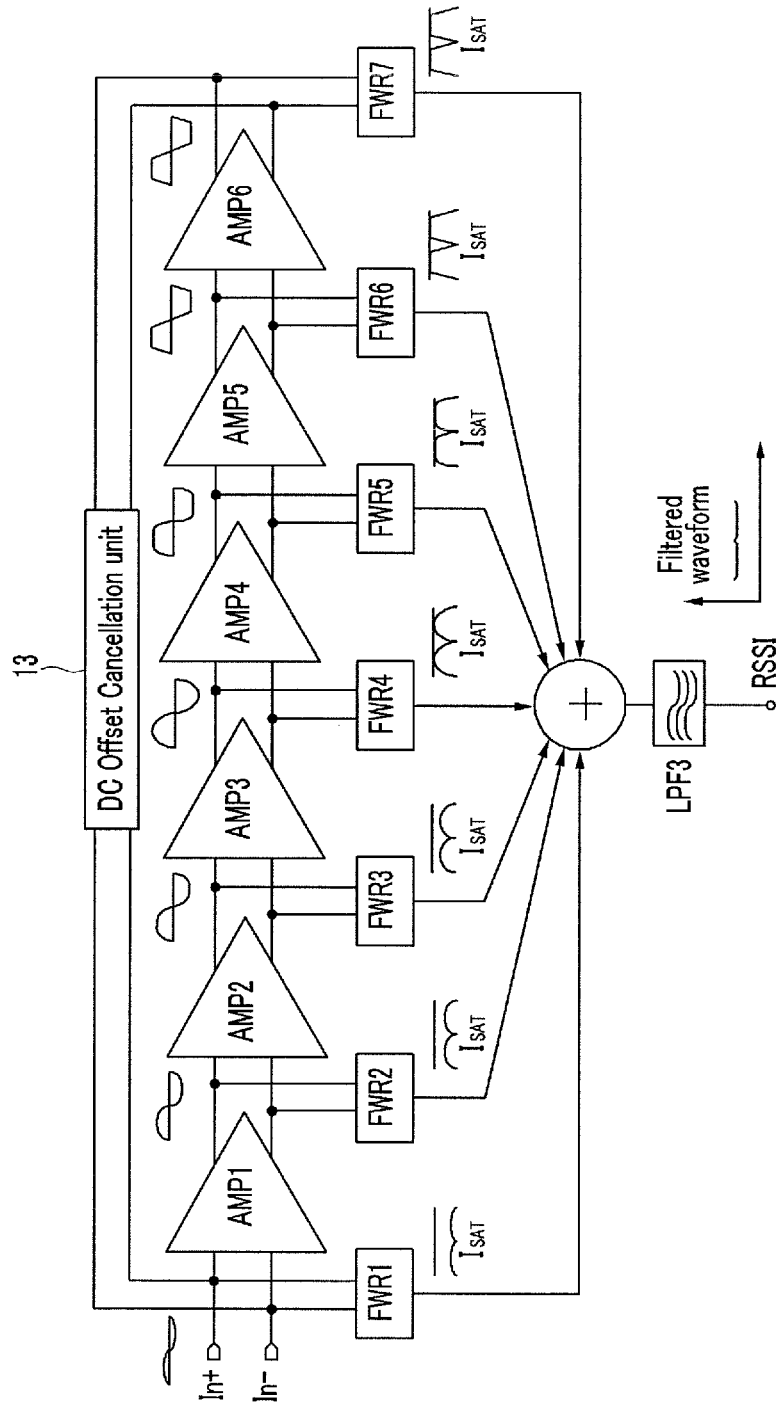
FIG. 2 shows a block diagram of a received signal strength indicator according to an exemplary embodiment of the present invention.

FIG. 2 shows a block diagram of a received signal strength indicator according to an exemplary embodiment of the present invention.

As shown in FIG. 2, the received signal strength indicator RSSI according to an exemplary embodiment of the present invention includes six differential amplifiers AMP1~AMP6, seven wave rectifiers FWR1~FWR7, a secondary low pass filter LPF3, and a DC offset cancelling unit 13.

The accuracy of the received signal strength indicator RSSI is mainly determined based on the number of differential amplifiers. For a target error of 1 dB, the received signal strength indicator RSSI according to the exemplary embodiment of the present includes six differential amplifiers AMP1~AMP6, but is not restricted thereto. The six differential amplifiers AMP1~AMP6 form an amplifier chain. That is, the output signals of the band pass filters BPF1 and BPF2 in FIG. 1 are amplified by the amplifier chain of the six differential amplifiers AMP1~AMP6.

The wave rectifier FWR1 rectifies differential signals output from the band pass filters BPF1 and BPF2 in FIG. 1. Each of the six wave rectifiers FWR2~FWR7 rectifies a differential signal output from each of the six differential amplifiers AMP1~AMP6. The output signals of the seven wave rectifiers FWR1~FWR7 are combined and filtered to be a display voltage such as a DC voltage. The operation of the received signal strength indicator RSSI will now be described. For example, when the differential signals output from the band pass filters BPF1 and BPF2 saturate the fourth stage of the amplifier chain, there is no current in the wave rectifiers after the fourth stage and current $I_{SAT}$ flows in the wave rectifiers before the fourth stage. Also, a variable current flows in the wave rectifier of the fourth stage according to a voltage according to the V-I curve of the wave rectifier. Therefore, when designing a wave rectifier, transconductance Gm should be constant over a wide range of input voltages. That is, a wave rectifier of a wide linear range is necessary to implement a wide-range RSSI.

Next, referring to FIG. 3, the wave rectifier according to the first exemplary embodiment of the present invention will be described.

Figure 3:
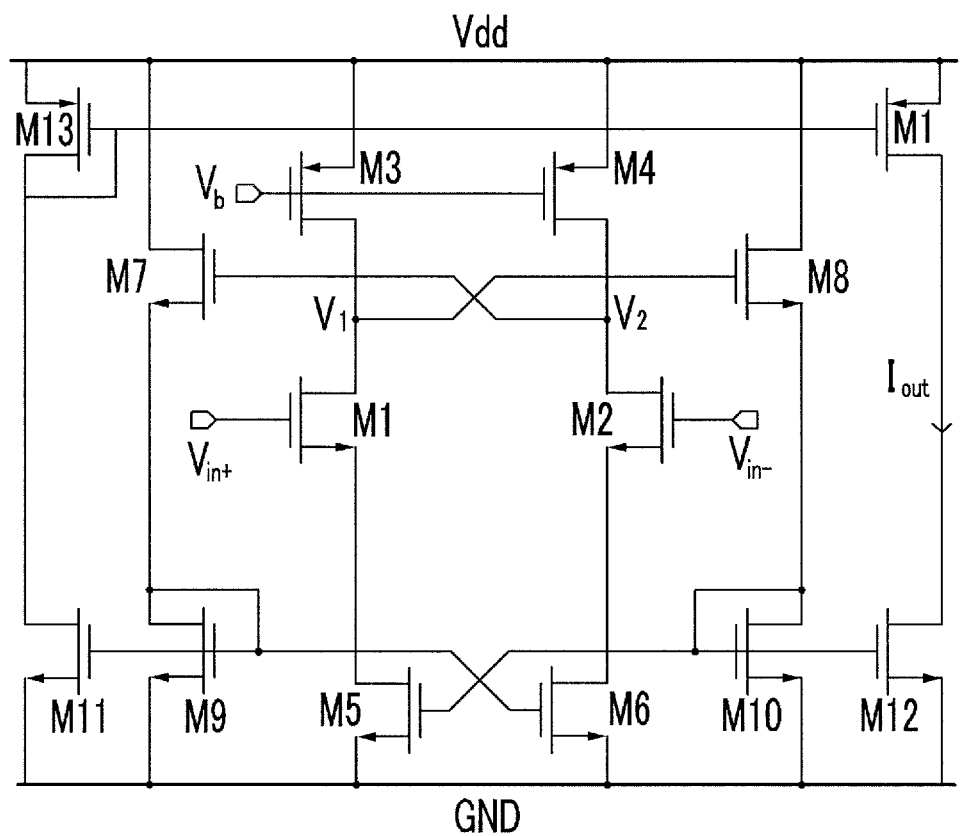
FIG. 3 shows a circuit diagram of a wave rectifier according to the first exemplary embodiment of the present invention.

FIG. 3 shows a circuit diagram of the wave rectifier according to the first exemplary embodiment of the present invention.

A class A-B voltage-to-current converter as shown in FIG. 3 may be used for implementing a wave rectifier with a wide linear range. The wave rectifier according to the first exemplary embodiment of the present invention includes eight N-channel metal oxide semiconductor (NMOS) transistors M1, M2, and M5 to M12, and four P-channel metal oxide semiconductor (PMOS) transistors M3, M4, M13, and M14. The input of the wave rectifier according to the first exemplary embodiment of the present invention includes the first input voltage Vin+ and the second input voltage Vin−, and the output of the wave rectifier is output current Iout.

The NMOS transistor M1 includes a drain electrode connected to a drain electrode of the PMOS transistor M3, a gate electrode connected to the first input voltage Vin+, and a source electrode connected to a drain electrode of the NMOS transistor M5.

The NMOS transistor M2 includes a drain electrode connected to a drain electrode of the PMOS transistor M4, a gate electrode connected to the second input voltage Vin−, and a source electrode connected to a drain electrode of the NMOS transistor M6.

The PMOS transistor M3 includes a source electrode connected to the supply voltage Vdd, a gate electrode connected to the bias voltage Vb, and a drain electrode connected to a drain electrode of the NMOS transistor M1.

The PMOS transistor M4 includes a source electrode connected to the supply voltage Vdd, a gate electrode connected to the bias voltage Vb, and a drain electrode connected to a drain electrode of the NMOS transistor M2.

The NMOS transistor M5 includes a drain electrode connected to a source electrode of the NMOS transistor M1, a gate electrode connected to a source electrode of the NMOS transistor M8, and a source electrode connected to the ground voltage GND.

The NMOS transistor M6 includes a drain electrode connected to a source electrode of the NMOS transistor M2, a gate electrode connected to a source electrode of the NMOS transistor M7, and a source electrode connected to the ground voltage GND.

The NMOS transistor M7 includes a drain electrode connected to the supply voltage Vdd, a gate electrode connected to a drain electrode of the PMOS transistor M4, and a source electrode connected to a drain electrode of the NMOS transistor M9.

The NMOS transistor M8 includes a drain electrode connected to the supply voltage Vdd, a gate electrode connected to a drain electrode of the PMOS transistor M3, and a source electrode connected to a drain electrode of the NMOS transistor M10.

The NMOS transistor M9 includes a drain electrode connected to a source electrode of the NMOS transistor M7, a gate electrode connected to a source electrode of the NMOS transistor M7, and a source electrode connected to the ground voltage GND.

The NMOS transistor M10 includes a drain electrode connected to a source electrode of the NMOS transistor M8, a gate electrode connected to a source electrode of the NMOS transistor M8, and a source electrode connected to the ground voltage GND.

The NMOS transistor M11 includes a drain electrode connected to a drain electrode of the PMOS transistor M13, a gate electrode connected to a source electrode of the NMOS transistor M7, and a source electrode connected to the ground voltage GND.

The NMOS transistor M12 includes a drain electrode connected to a drain electrode of the NMOS transistor M14, a gate electrode connected to a source electrode of the NMOS transistor M8, and a source electrode connected to the ground voltage GND.

The PMOS transistor M13 includes a source electrode connected to the supply voltage Vdd, a gate electrode connected to a drain electrode of the PMOS transistor M13, and a drain electrode connected to a drain electrode of the NMOS transistor M11.

The PMOS transistor M14 includes a source electrode connected to supply voltage Vdd, a gate electrode connected to a gate electrode of the PMOS transistor M13, and a drain electrode connected to a drain electrode of the NMOS transistor M12. The drain current of the PMOS transistor M14 corresponds to the output current Iout of the wave rectifier.

The transistors M3 to M6 are biased in a triode region. The feedback loop transistors M9~M12 bias the gate electrodes of the NMOS transistors M5 and M6 so that the NMOS transistors M5 and M6 maintain a triode operation. Therefore, the voltages V1 and V2 at the drain electrodes of the NMOS transistors M1 and M2 may be very close to the supply voltage Vdd. The source voltage of the NMOS transistors M1 and M2 may be as low as several tens of mV and may be negligible. The transfer function is shown in Equation 1.

$$I_{out} = I_{M7} - I_{M8} = \frac{K'_n K_n (V_{cm} - V_{tn})(V_{nl} - 2V_{tn})}{2K_p(V'_b - V_{tp})} V_{id} \quad \text{(Equation 1)}$$

In Equation 1, Kn represents a transconductance parameter of each of the NMOS transistors M1 and M2, Kn' represents a transconductance parameter of each of the NMOS transistors M7 and M8, and Kp represents a transconductance parameter of each of the NMOS transistors M3 and M4. Vtp and Vtn represent threshold voltages of the PMOS transistor and the NMOS transistor. $V_{id}=V_{in+}-V_{in-}$, $V'_b=V_{dd}-V_b$, $V_{nl} \approx V_1+V_2-2V_{s,M7,M8}$, and $V_1-V_2=V_{d,M3}-V_{d,M4}$ are satisfied. As known from Equation 1, the output current $I_{out}$ is a function of the differential input voltage $V_{in}$.

As above, the voltages V1 and V2 at the drain electrodes of the NMOS transistors M1 and M2 is very close to the supply voltage Vdd. The value of V1+V2 is almost constant and its nonlinear effect may be ignored. However, when a voltage of lower than 2 V is supplied, a nonlinear term can occur. Particularly, when the supply voltage is lower than 1.8 V, the nonlinear term becomes more significant.

Next, referring to FIG. 4, the wave rectifier according to the second exemplary embodiment of the present invention will be described.

Figure 4:
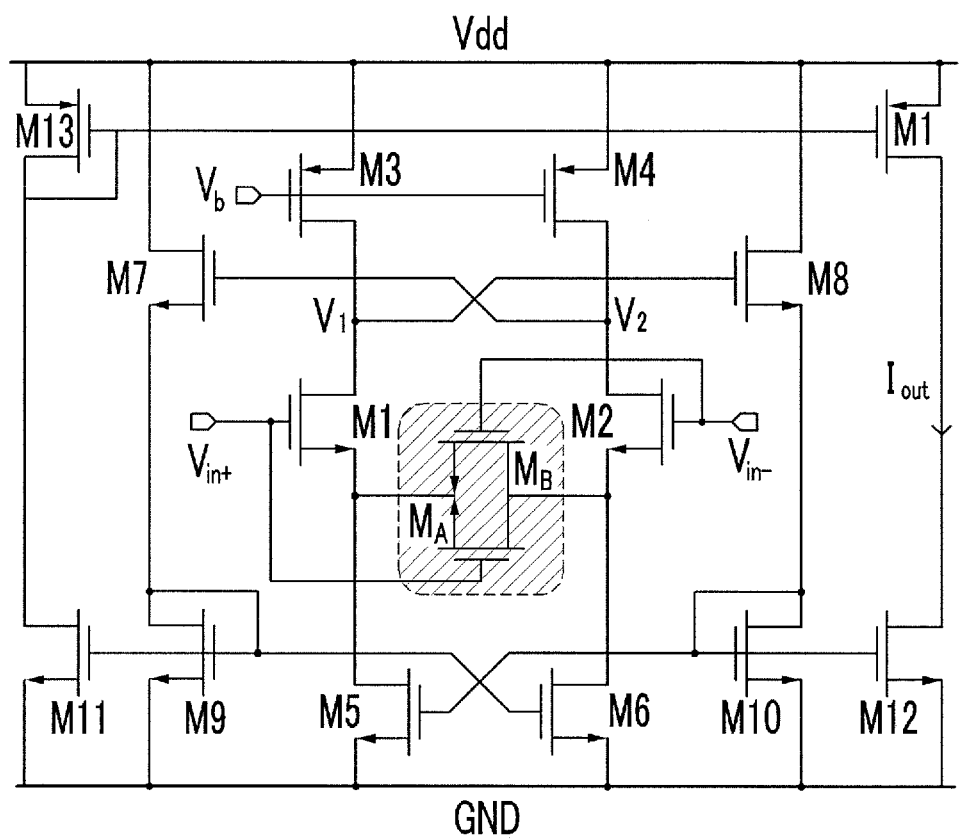
FIG. 4 shows a circuit diagram of a wave rectifier according to the second exemplary embodiment of the present invention.

FIG. 4 shows a circuit diagram of the wave rectifier according to the second exemplary embodiment of the present invention.

As shown in FIG. 4, the wave rectifier according to the second exemplary embodiment of the present invention further includes two NMOS transistors $M_A$ and $M_B$ besides the wave rectifiers in FIG. 3.

The NMOS transistor $M_A$ includes a drain electrode connected to the source electrode of the NMOS transistor M2, a gate electrode connected to the first input voltage Vin+, and a source electrode connected to the source electrode of the NMOS transistor M1.

The NMOS transistor $M_B$ includes a drain electrode connected to the source electrode of the NMOS transistor M2, a gate electrode connected to the second input voltage Vin−, and a source electrode connected to the source electrode of the NMOS transistor M1.

To improve the linearity, a class AB V-I linearization technique with source degeneration using a MOS transistor may be used. The gate electrodes of the NMOS transistors $M_A$ and $M_B$ are connected to the differential input voltage rather than to a bias voltage. Consequently, triode transistors $M_A$ and $M_B$ undergo varying bias conditions to improve the linearity of the circuit. The drain-source voltage of the NMOS transistors $M_A$ and $M_B$ is zero. However, the gate-source voltage of the NMOS transistors $M_A$ and $M_B$ equals that of the NMOS transistors M1 and M2. This implies that the NMOS transistors $M_A$ and $M_B$ are indeed in the triode region. The small-signal drain-source resistance $r_{dSA}$ and $r_{dsB}$ of the NMOS transistors $M_A$ and $M_B$ is determined based on Equation 2.

$$r_{dsA} = r_{dsB} = \frac{1}{2K_{nA}(V_{GS1} - V_{tn})} \quad \text{(Equation 2)}$$

If the NMOS transistor M1 is the same as the NMOS transistor M2 and the NMOS transistor $M_A$ is the same as the NMOS transistor $M_B$, the transconductance parameter $K_{nl}$ of the NMOS transistors M1 and M2 and the transconductance parameter $K_{nA}$ of the NMOS transistors $M_A$ and $M_B$ are as shown in Equation 3.

$$k_{n1} = \frac{\mu_n C_{ox}}{2}\left(\frac{W}{L}\right)_1 \text{ and} \quad \text{(Equation 3)}$$
$$k_{nA} = \frac{\mu_n C_{ox}}{2}\left(\frac{W}{L}\right)_A$$

In Equation 3, $\mu_n$ represents electron mobility, $C_{ox}$ represents oxide capacitance, W represents the width of a channel, and L represents the length of the channel.

The small-signal drain-source resistance $r_{s1}$ and $r_{s2}$ of the NMOS transistors M1 and M2 is as shown in Equation 4.

$$r_{s1} = r_{s2} = \frac{1}{2K_{n1}(V_{GS1} - V_{tn})} \quad \text{(Equation 4)}$$

If using a small signal T model, the transconductance $G_m$ of the wave rectifier may be determined based on Equation 5.

$$G_m = \frac{4K_{n1}K_{nA}(V_{GS1} - V_{tn})}{(K_{n1} + 4K_{nA})} \quad \text{(Equation 5)}$$

As seen from Equation 5, there is no nonlinear item and thus the transconductance $G_m$ is constant over the wide-range input signal.

Next, it will be described how the triode transistors $M_A$ and $M_B$ help to improve the linearity of the wave rectifier.

In a small input signal, the triode transistors $M_A$ and $M_B$ operate as two source degeneration resistors. As above, the linearity improves over the input signal of a simple differential configuration. In this case, the linearity of this circuit is similar to that of a circuit in which the gates of the triode transistors $M_A$ and $M_B$ are connected to a fixed bias voltage.

If the amplitude of the first input voltage $V_{in+}$ and the second input voltage $V_{in-}$ increase, the value of $V_1+V_2$ will be reduced due to the saturation in $V_1$ or $V_2$, and therefore the value of $V_1+V_2$ is no longer constant for large input signals. To alleviate this reduction for large input signals, the gate electrodes of the transistors $M_A$ and $M_B$ connected to the input signals as shown in FIG. 4 may be helpful. If the input signal increases, the drain-source resistance of the transistor $M_A$ or $M_B$ reduces as shown in Equation 2. The reduced drain-source resistance tends to boost the value of the $V_1+V_2$ resulting in partial canceling of the $V_1+V_2$ reduction. Therefore, by using two triode transistors $M_A$ and $M_B$, constant current through the triode transistors M1 and M2 will be forced. The constant current through the NMOS transistors M1 and M2 means that the value of $V_1+V_2$ is maintained to be constant, which helps to maintain the linearity range. Thus, if a proper ratio of $K_1/K_A$ is chosen, more stable transconductance is achieved. From simulation processes, it is shown that the ratio $K_1/K_A=5$ will be an optimum ratio.

Next, referring to FIG. 5, a differential amplifier according to an exemplary embodiment of the present invention will be described.

Figure 5:
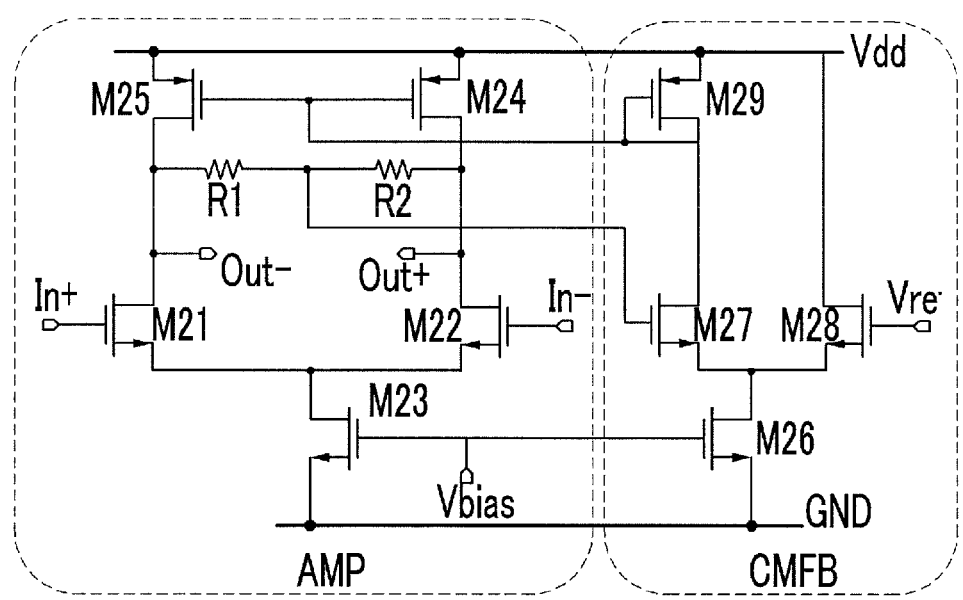
FIG. 5 shows a circuit diagram of a differential amplifier according to an exemplary embodiment of the present invention.

FIG. 5 shows a circuit diagram of a differential amplifier according to an exemplary embodiment of the present invention.

As shown in FIG. 5, the differential amplifier according to an exemplary embodiment of the present invention adopts a simple differential pair with active loading. The differential amplifier includes two resistors R1 and R2, six NMOS transistors M21~M23 and M26~M28, and three PMOS transistors M24, M25, and M29. In FIG. 5, the input of the differential amplifier includes the first input voltage In+ and the second input voltage In−. The output of the differential amplifier includes the first output voltage Out+ and the second output voltage Out−.

The resistor R1 includes a terminal connected to a drain electrode of the PMOS transistor M25. The resistor R2 includes a terminal connected to a drain electrode of the PMOS transistor M24 and the other terminal connected to the other terminal of the resistor R1.

The NMOS transistor M21 includes a drain electrode connected to the drain electrode of the PMOS transistor M25, a gate electrode connected to the first input voltage In+, and a source electrode connected to the drain electrode of the NMOS transistor M23.

The NMOS transistor M22 includes a drain electrode connected to the drain electrode of the PMOS transistor M24, a gate electrode connected to the second input voltage In−, and a source electrode connected to the drain electrode of the NMOS transistor M23.

The NMOS transistor M23 includes a drain electrode connected to the source electrode of the NMOS transistor M21, a gate electrode connected to the bias voltage, and a source electrode connected to the ground voltage GND.

The PMOS transistor M24 includes a source electrode connected to the supply voltage Vdd, a gate electrode connected to the drain electrode of the PMOS transistor M29, and a drain electrode connected to the drain electrode of the NMOS transistor M22.

The PMOS transistor M25 includes a source electrode connected to the supply voltage Vdd, a gate electrode connected to the drain electrode of the PMOS transistor M29, and a drain electrode connected to the drain electrode of the NMOS transistor M21.

The NMOS transistor M26 includes a drain electrode connected to the source electrode of the NMOS transistor M27, a gate electrode connected to the bias voltage, and a source electrode connected to the ground voltage GND.

The NMOS transistor M27 includes a drain electrode connected to the drain electrode of the PMOS transistor M29, a gate electrode connected to the other terminal of the resistor R1, and a source electrode connected to the drain electrode of the NMOS transistor M26.

The NMOS transistor M28 includes a drain electrode connected to the supply voltage Vdd, a gate electrode connected to the reference voltage Vref, and a source electrode connected to the drain electrode of the NMOS transistor M26.

The PMOS transistor M29 includes a source electrode connected to the supply voltage Vdd, a gate electrode connected to the drain electrode of the PMOS transistor M29, and a drain electrode connected to the drain electrode of the NMOS transistor M27.

The NMOS transistor M23 operates a current source with the value of 120 µA.

The transistors M26 to M29 form a common mode feedback stabilizing a DC output voltage.

Next, referring to FIG. 6, a DC offset cancelling unit according to an exemplary embodiment of the present invention will be described.

Figure 6:
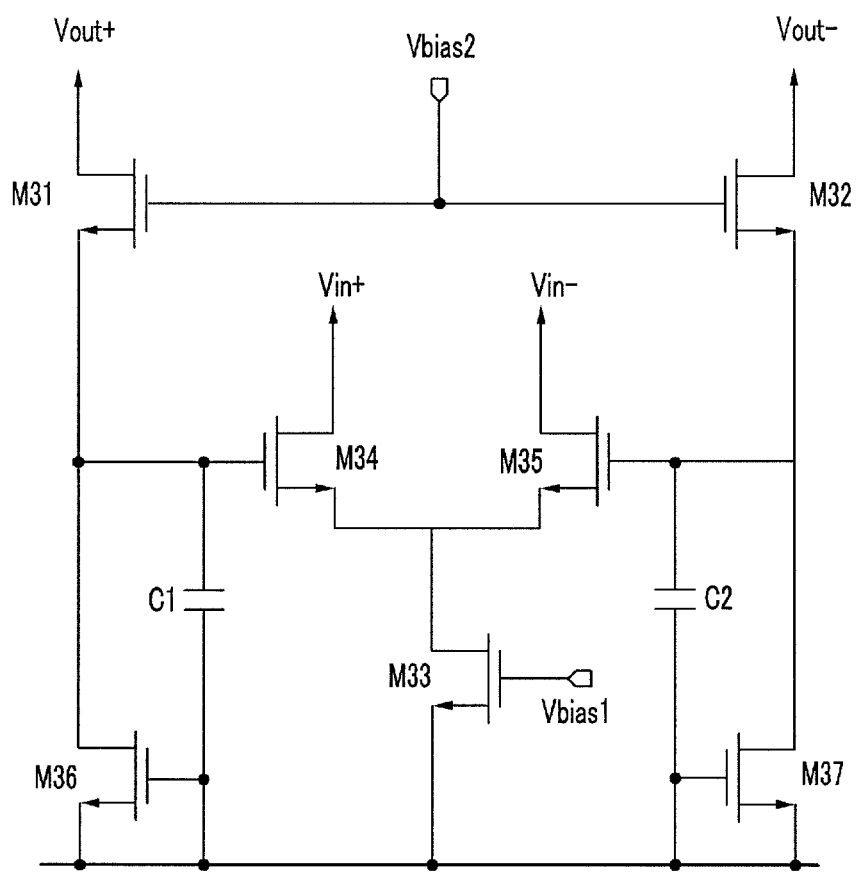
FIG. 6 shows a circuit diagram of a direct current (DC) offset canceling unit according to an exemplary embodiment of the present invention.

FIG. 6 shows a circuit diagram of a DC offset cancelling unit according to an exemplary embodiment of the present invention.

The DC offset cancelling unit according to an exemplary embodiment of the present invention is located between the output of the last stage and the input of the first stage as shown in FIG. 2.

As shown in FIG. 6, the DC offset cancelling unit 13 according to an exemplary embodiment of the present invention includes seven NMOS transistors M31 to M37 and two capacitors C1 and C2. In FIG. 6, the input of the DC offset cancelling unit 13 is the first output voltage Vout+ of the last gain stage of the amplifier chain, and the output of the DC offset cancelling unit 13 is the first input voltage Vin+ and the second input voltage Vin− of the first gain stage of the amplifier chain.

The NMOS transistor M31 includes a drain electrode connected to the first output voltage Vout+, a gate electrode connected to the bias voltage Vbias 2, and a source electrode connected to the drain electrode of the NMOS transistor M36.

The NMOS transistor M32 includes a drain electrode connected to the second output voltage Vout−, a gate electrode connected to the bias voltage Vbias2, and a source electrode connected to the drain electrode of the NMOS transistor M37.

The NMOS transistor M33 includes a drain electrode connected to the source electrode of the NMOS transistor M34, a gate electrode connected to the bias voltage Vbias 1, and a source electrode connected to the ground voltage GND.

The NMOS transistor M34 includes a drain electrode connected to the first input voltage Vin+, a gate electrode connected to the source electrode of the NMOS transistor M31, and a source electrode connected to the drain electrode of the NMOS transistor M33.

The NMOS transistor M35 includes a drain electrode connected to the second input voltage Vin−, a gate electrode connected to the source electrode of the NMOS transistor M32, and a source electrode connected to the drain electrode of the NMOS transistor M33.

The NMOS transistor M36 includes a drain electrode connected to the source electrode of the NMOS transistor M31, a gate electrode connected to the ground voltage GND, and a source electrode connected to the ground voltage GND.

The NMOS transistor M37 includes a drain electrode connected to the source electrode of the NMOS transistor M32, a gate electrode connected to the ground voltage GND, and a source electrode connected to the ground voltage GND.

The capacitor C1 includes a terminal connected to the source electrode of the NMOS transistor M31 and the other terminal connected to the ground voltage GND.

The capacitor C2 includes a terminal connected to the source electrode of the NMOS transistor M32 and the other terminal connected to the ground voltage GND.

The NMOS transistors M31 and M32 function as large resistance which forms low pass filter characteristic with the capacitors C1 and C2. A low frequency signal is filtered and input to the gate of the differential pair comprised of the transistors M33 and M34, and is then feedback to the first stage of the amplifier chain to cancelling a DC offset signal.

Figure 7:
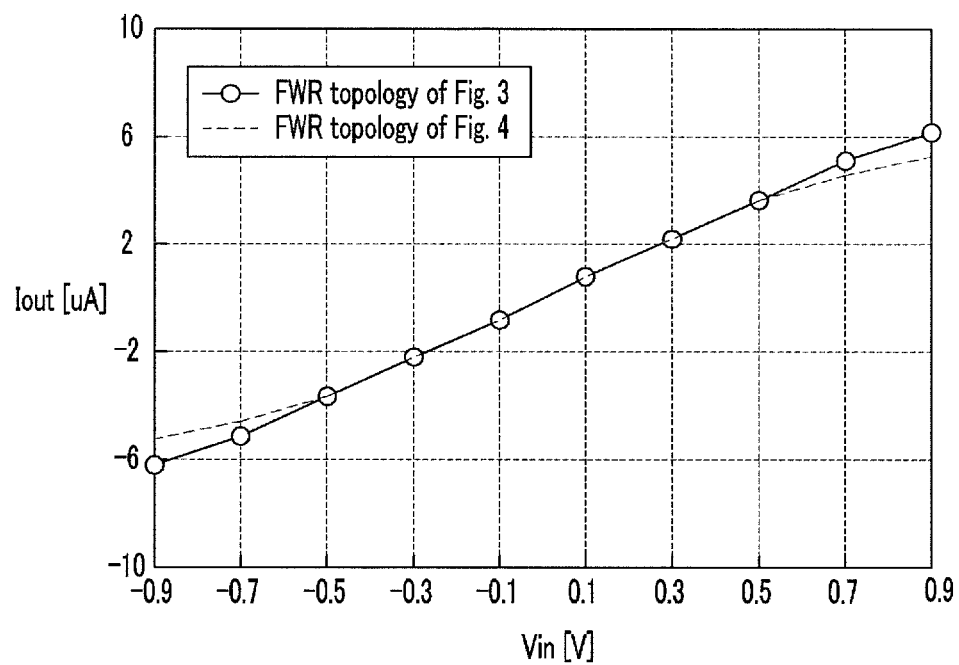
FIG. 7 shows volt-ampere characteristics of a wave rectifier according to the second exemplary embodiment of the present invention.

FIG. 7 shows voltage-current characteristics of the wave rectifier according to an exemplary embodiment of the present invention.

In FIG. 7, the dotted line represents the voltage-current characteristic of the wave rectifier according to the first exemplary embodiment in FIG. 3, and the solid line shows the voltage-current characteristic of the wave rectifier according to the second exemplary embodiment in FIG. 4.

As seen from FIG. 7, the wave rectifier according to the second exemplary embodiment has a wider linear characteristic than that of the wave rectifier according to the first exemplary embodiment.

Figure 8:
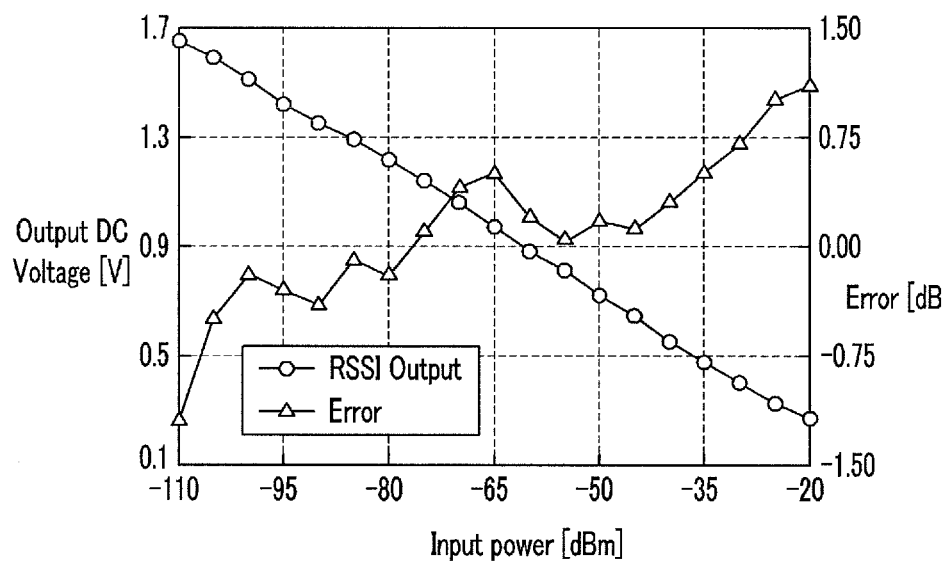
FIG. 8 shows simulated results of a received signal strength indicator (RSSI) according to an exemplary embodiment of the present invention.

FIG. 8 shows the simulation result of the received signal strength indicator RSSI according to the exemplary embodiment of the present invention.

Particularly, FIG. 8 shows the simulation result of the received signal strength indicator RSSI using a wide range wave rectifier implemented based on a wide-linear-range voltage-to-current converter. Here, the wide-linear-range voltage-to-current converter may be designed by adopting a class AB voltage-current technology with source degeneration using a MOS transistor. According to the simulation result in FIG. 8, the received signal strength indicator can detect an input signal power from −110 dBm to −20 dBm with an error of ±1.0 dB. If it is implemented in 0.18 μm CMOS technology, the received signal strength indicator consumes about 2 mW from the supply voltage of 1.8 V. The simulation results of the implemented received signal strength indicator may be summarized in Table 1.

TABLE 1

| Parameters | Value |
| --- | --- |
| Technology | 0.18 μm CMOS |
| Supply voltage [V] | 1.8 |
| Current consumption [mA] | 1.1 |
| Total gain [dB] | 72 |
| Bandwidth [MHz] | 10 |
| RSSI dynamic [dB] | 90 (−110~−20) |
| RSSI error [dB] | ±1.2 |

According to an exemplary embodiment of the present invention, it is possible to implement a wide-range received signal strength indicator with low power.

An exemplary embodiment of the present invention may not only be embodied through the above-described apparatus and/or method, but may also be embodied through a program that executes a function corresponding to a configuration of the exemplary embodiment of the present invention or through a recording medium on which the program is recorded, and can be easily embodied by a person of ordinary skill in the art from a description of the foregoing exemplary embodiment.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A rectifier comprising: a first transistor including a gate electrode connected to an input voltage; a second transistor including a gate electrode connected to a second input voltage; a third transistor including a source electrode connected to a source electrode of the first transistor, a drain electrode connected to a source electrode of the second transistor, and a gate electrode connected to the first input voltage; and a fourth transistor including a source electrode connected to the source electrode of the first transistor, a drain electrode connected to the source electrode of the second transistor, and a gate electrode connected to the second input voltage.

2. The rectifier of claim 1, further comprising: a fifth transistor including a gate electrode connected to a drain electrode of the first transistor; and a sixth transistor including a gate electrode connected to a source electrode of the fifth transistor.

3. The rectifier of claim 2, further comprising: a seventh transistor including a gate electrode connected to a drain electrode of the second transistor; an eighth transistor including a gate electrode connected to a source electrode of the seventh transistor; and a ninth transistor including a gate electrode connected to a drain electrode of the eighth transistor and a drain electrode connected to a drain electrode of the sixth transistor.

4. The rectifier of claim 3, further comprising: a tenth transistor including a gate electrode connected to a bias voltage and a drain electrode connected to the drain electrode of the fifth transistor; and an eleventh transistor including a gate electrode connected to a bias voltage and a drain electrode connected to the drain electrode of the second transistor.

5. The rectifier of claim 4, further comprising: a twelfth transistor including a drain electrode connected to the source electrode of the first transistor and a gate electrode connected to the source electrode of the fifth transistor; and a thirteenth transistor including a drain electrode connected to the source electrode of the second transistor and a gate electrode connected to the source electrode of the seventh transistor.

6. The rectifier of claim 5, further comprising: a fourteenth transistor including a drain electrode connected to the source electrode of the seventh transistor and a gate electrode connected to the source electrode of the seventh transistor, and a fifteenth transistor including a drain electrode connected to the source electrode of the fifth transistor and a gate electrode connected to the source electrode of the fifth transistor.

7. The rectifier of claim 6, further comprising a sixteenth transistor including a drain electrode connected to the drain electrode of the eighth transistor and a gate electrode connected to the drain electrode of the eighth transistor.

8. A rectifier comprising: a class AB voltage-current converter including a first transistor of which a gate electrode is connected to a first input voltage and a second transistor of which a gate electrode is connected to a second input voltage; a third transistor including a source electrode connected to a source electrode of the first transistor, a drain electrode connected to a source electrode of the second transistor, and a gate electrode connected to the first input voltage; and a fourth transistor including a source electrode connected to the source electrode of the first transistor, a drain electrode connected to the source electrode of the second transistor, and a gate electrode connected to the second input voltage.

9. The rectifier of claim 8, further comprising: a fifth transistor including a gate electrode connected to a drain electrode of the first transistor; and a sixth transistor including a gate electrode connected to a source electrode of the fifth transistor.

10. The rectifier of claim 9, further comprising: a seventh transistor including a gate electrode connected to the source electrode of the second transistor; an eighth transistor including a gate electrode connected to a source electrode of the seventh transistor; and a ninth transistor including a gate electrode connected to a drain electrode of the eighth transistor and a drain electrode connected to the drain electrode of the fourth transistor.

11. A received signal strength indicator, comprising: a plurality of differential amplifiers for forming an amplifier chain that amplifies differential signals; a plurality of rectifiers for rectifying output signals from the plurality of differential amplifiers and the differential signals, respectively; and a first low pass filter for combining output signals from the plurality of rectifiers and outputting received signal strength, wherein at least one input among inputs for the plurality of rectifiers includes a first input voltage and a second input voltage, and at least one among the plurality of rectifiers includes: a first transistor including a gate electrode connected to the first input voltage; and a second transistor including source electrode connected to a source electrode of the first transistor, a drain electrode connected to a drain electrode of the first transistor, and a gate electrode connected to the second input voltage, wherein the at least one among the plurality of rectifiers further includes: a third transistor including a gate electrode connected to the first input voltage and a source electrode connected to the source electrode of the first transistor; and a fourth transistor including a gate electrode connected to the second input voltage and a source electrode connected to the drain electrode of the first transistor.

12. The received signal strength indicator of claim 11, further comprising: a fifth transistor including a gate electrode connected to a drain electrode of the third transistor; and a sixth transistor including a gate electrode connected to a source electrode of the fifth transistor.

13. The received signal strength indicator of claim 12, further comprising: a seventh transistor including a gate electrode connected to a drain electrode of the fourth transistor; an eighth transistor including a gate electrode connected to a source electrode of the seventh transistor; and a ninth transistor including a gate electrode connected to a drain electrode of the eighth transistor and a drain electrode connected to a drain electrode of the sixth transistor.

14. The received signal strength indicator of claim 11, wherein at least one among the plurality of differential amplifiers is provided with a third input voltage and outputs a first output voltage, and at least one among the plurality of differential amplifiers includes: a fifth transistor including a gate electrode connected to the third input voltage and a drain electrode connected to the first output voltage; and a sixth transistor including a drain electrode connected to the drain electrode of the sixth transistor.

15. The received signal strength indicator of claim 14, wherein at least one among the plurality of differential amplifiers is further provided with a fourth input voltage and further outputs a second output voltage, and at least one among the plurality of differential amplifiers includes: a seventh transistor including a gate electrode connected to the fourth input voltage and a drain electrode connected to the second output voltage; an eighth transistor including a drain electrode connected to the drain electrode of the seventh transistor; and a ninth transistor including a gate electrode connected to a bias voltage.

16. The received signal strength indicator of claim 15, wherein the at least one among the plurality of differential amplifiers further includes: a first resistor including a terminal connected to the drain electrode of the sixth transistor; a second resistor including a terminal connected to the drain electrode of the eighth transistor and the other terminal connected to the other terminal of the first resistor; a tenth transistor including a gate electrode connected to a gate electrode of the sixth transistor and a drain electrode connected to the gate electrode of the sixth transistor; an eleventh transistor including a drain electrode connected to the drain electrode of the tenth transistor and a gate electrode connected to the other terminal of the first resistor; a twelfth transistor including a source electrode connected to a source electrode of the eleventh transistor and a gate electrode connected to a reference voltage; and a thirteenth transistor including a drain electrode connected to the source electrode and a gate electrode connected to the bias voltage.

17. The received signal strength indicator of claim 11, further comprising: a second low pass filter; and a fifth transistor.

18. A receiver, comprising: a first low pass filter for filtering an in-phase signal; a second low pass filter for filtering a quadrature phase signal; and a received signal strength indicator, wherein the received signal strength indicator includes: a plurality of differential amplifiers forming an amplifier chain that uses the filtered in-phase signal and the filtered quadrature phase signal as differential signals and amplifies the differential signals; and a plurality of rectifiers for rectifying output signals from the plurality of differential amplifiers and the differential signals, respectively, wherein at least one among the plurality of rectifiers includes: a first transistor including a gate electrode connected to a first input voltage; and a second transistor including a source electrode connected to a source electrode of the first transistor, a drain electrode connected to a drain electrode of the first transistor, and a gate electrode connected to a second input voltage, wherein the at least one among the plurality of rectifiers further includes: a third transistor including a gate electrode connected to the first input voltage and a source electrode connected to the source electrode of the first transistor; and a second transistor including a gate electrode connected to the second input voltage and a source electrode connected to the drain electrode of the first transistor.

* * * * *